US012648493B2

(12) United States Patent (10) Patent No.: US 12,648,493 B2
Chen et al. (45) Date of Patent: Jun. 2, 2026

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Yen-Ming Chen, Chu-Pei City (TW); Yung-Chi Lin, Su-Lin City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 397 days.

(21) Appl. No.: 18/388,326

(22) Filed: Nov. 9, 2023

(65) Prior Publication Data

US 2025/0158005 A1    May 15, 2025

(51) Int. Cl.
| | |
|---|---|
| *H10W 90/00* | (2026.01) |
| *H10W 80/00* | (2026.01) |
| *H10W 90/20* | (2026.01) |

(52) U.S. Cl.
CPC .......... *H10W 90/00* (2026.01); *H10W 80/211* (2026.01); *H10W 80/312* (2026.01); *H10W 80/327* (2026.01); *H10W 90/297* (2026.01); *H10W 90/792* (2026.01)

(58) Field of Classification Search
None
See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |

(Continued)

FOREIGN PATENT DOCUMENTS

| | | |
|---|---|---|
| CN | 104253056 A | 12/2014 |
| KR | 20210122628 A | 10/2021 |

(Continued)

OTHER PUBLICATIONS

Yung-Chi Lin et al., "Bonding Semiconductor Dies Through Wafer Bonding Processes," U.S. Appl. No. 18/326,316, filed May 31, 2023, 51 pages.

*Primary Examiner* — Bo B Jang

(74) *Attorney, Agent, or Firm* — Slater Matsil, LLP

(57) ABSTRACT

A wafer on wafer on wafer and a chip on wafer on wafer structure and methods of forming the same are provided. In accordance with some embodiments, a first device wafer is bonded to a first carrier through wafer-on-wafer bonding and additional device wafers may subsequently be bonded to the first device wafer. A support wafer is then bonded to the top most device wafer and the first wafer may then be removed. The bonded wafer structure may then be singulated into individual semiconductor device packages. Through the wafer-on-wafer bonding process, the manufacturing cost and cycle time may be reduced.

20 Claims, 14 Drawing Sheets

600

(56)        References Cited

U.S. PATENT DOCUMENTS

| | | |
|---|---|---|
| 10,068,877 B2 | 9/2018 | Lee |
| 2015/0001685 A1 | 1/2015 | Chung et al. |
| 2018/0158749 A1 | 6/2018 | Yu et al. |
| 2020/0402960 A1* | 12/2020 | Chen .................... H01L 25/0657 |
| 2021/0066248 A1* | 3/2021 | Chen .................... H01L 21/568 |
| 2021/0082874 A1 | 3/2021 | Chen |
| 2021/0134663 A1 | 5/2021 | Huang et al. |
| 2021/0167040 A1 | 6/2021 | You et al. |
| 2021/0305205 A1 | 9/2021 | Hsieh et al. |
| 2022/0352082 A1 | 11/2022 | Yu et al. |
| 2022/0352092 A1 | 11/2022 | Chang |
| 2022/0395953 A1 | 12/2022 | Chang et al. |
| 2023/0352439 A1 | 11/2023 | Chen et al. |

FOREIGN PATENT DOCUMENTS

| | | |
|---|---|---|
| KR | 20210148829 | 12/2021 |
| TW | 200414372 A | 8/2004 |
| TW | 201822311 A | 6/2018 |
| TW | 202243169 A | 11/2022 |
| TW | 202245200 A | 11/2022 |
| TW | 202249175 A | 12/2022 |
| TW | 202303775 A | 1/2023 |
| WO | 2004040655 A2 | 5/2004 |

* cited by examiner

630

650

688

600

630

650

1450

688

1400

SEMICONDUCTOR DEVICE AND METHOD OF MANUFACTURE

BACKGROUND

With the increasingly greater integration level of integrated circuits, semiconductor devices, instead of having all integrated circuits formed in the same die, having more and more device dies bonded together to form packages, wherein the device dies having different functions may work together to achieve system functions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
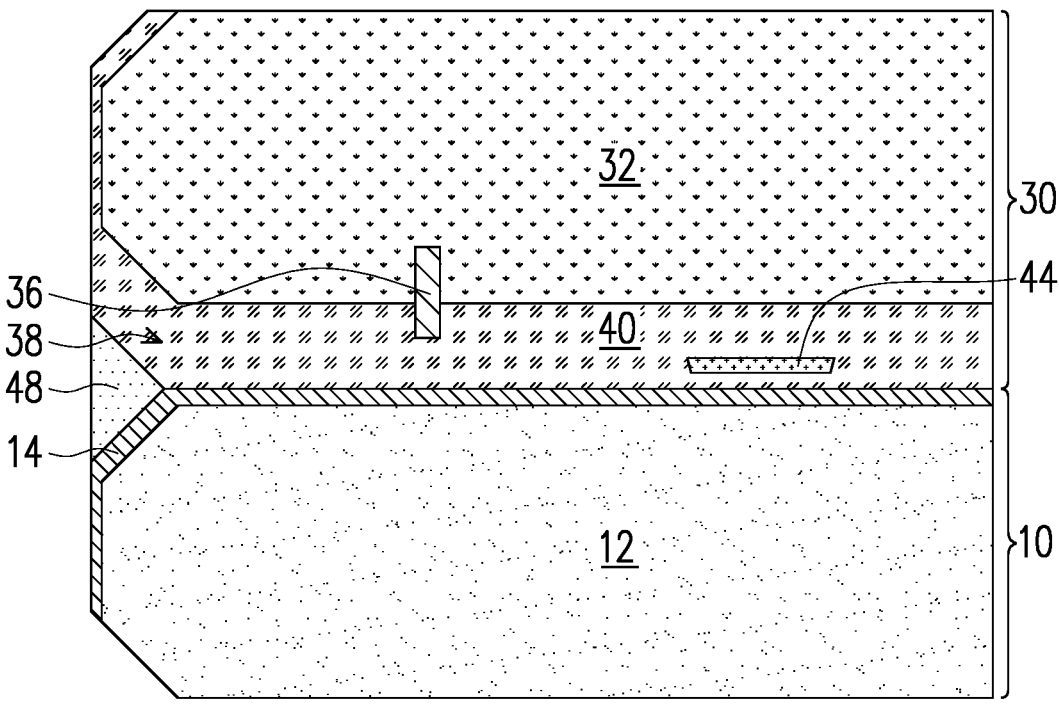
FIGS. 1-6 illustrate stages in a wafer on wafer bonding process and formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A wafer on wafer on wafer and a chip on wafer on wafer structure and methods of forming the same are provided. In accordance with some embodiments, a first device wafer is bonded to a first carrier through wafer-on-wafer bonding and additional device wafers may subsequently be bonded to the first device wafer. A support wafer is then bonded to the top most device wafer and the first wafer may then be removed. The bonded wafer structure may then be singulated into individual semiconductor device packages. Through the wafer-on-wafer bonding process, the manufacturing cost and cycle time may be reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 6 illustrate an embodiment in which a first semiconductor package 600 (illustrated in FIG. 6) is formed. In this embodiment, the first semiconductor package 600 is formed through various processing steps of bonding one or more device wafers directly to a first device wafer (e.g., a tier-1 device wafer, tier-1 referring to a first structure bonded to a carrier wafer) utilizing support and carrier wafers during the processing steps. The bonding of the plurality of device wafers to the other device wafers utilizing the support and carrier wafers results in a wafer-on-wafer-on-wafer (WoWoW) structure that may then be subsequently singulated into individual semiconductor packages (e.g., the first semiconductor package 600).

Referring to FIG. 1, wafer 10 is formed. In accordance with some embodiments, the wafer 10 is a carrier that has no active devices (such as transistors) and passive devices therein, and hence may be referred to as carrier 10 hereinafter. The carrier 10 may have a round top view shape, with FIG. 1 illustrating an edge part of the wafer 10. In accordance with some embodiments, the carrier 10 includes a substrate 12. The substrate 12 may be a blank substrate. In an embodiment, the substrate 12 may be a semiconductor substrate such as a silicon substrate. In some embodiments, the substrate 12 may include other semiconductor materials such as silicon germanium, carbon-doped silicon, or the like. The substrate 12 may be a bulk substrate, or may have a layered structure, for example, including a silicon substrate and a silicon germanium layer over the silicon substrate. In other embodiments, the substrate 12 may be formed of other materials such as ceramic, glass, silicate glass, or the like may also be used. In accordance with some embodiments, the entire substrate 12 is formed of a homogeneous material, with no other material different from the homogeneous material therein. For example, the substrate 12 may be formed of silicon (doped or undoped), and there is no metal region, dielectric region, etc., therein.

In another embodiment, the wafer 10 is a device wafer including active devices (such as transistors) and/or passive devices (such as capacitors, resistors, inductors, and/or the like) therein. The wafer 10, when being the device wafer, may be an un-sawed wafer including a semiconductor substrate continuously extending into all device dies in the wafer, or may be a reconstructed wafer including discrete device dies that are packaged in an encapsulant (such as a molding compound or inorganic gap-filling regions).

In an embodiment, a bond layer 14 is deposited or otherwise formed on the substrate 12. In accordance with some embodiments, the bond layer 14 is formed of or comprises a dielectric material, which may be a silicon-based dielectric material such as silicon oxide ($SiO_2$), SiN, SiON, SiOCN, SiC, SiCN, or the like, or combinations thereof. In accordance with some embodiments, the bond layer 14 is formed using High-Density Plasma Chemical Vapor Deposition (HDPCVD), Plasma Enhanced Chemical Vapor Deposition (PECVD), Chemical Vapor Deposition (CVD), Low-Pressure Chemical Vapor Deposition (LPCVD), Atomic Layer deposition (ALD), or the like.

In accordance with some embodiments, the bond layer 14 is in physical contact with the substrate 12. In accordance with other embodiments, the carrier 10 includes a plurality of layers (not shown) between the bond layer 14 and the substrate 12. For example, there may be an oxide-based layer formed of an oxide-based material (which may also be silicon oxide based) such as silicon oxide, phospho-silicate glass (PSG), borosilicate glass (BSG), boron-doped phospho silicate glass (BPSG), fluorine-doped silicate glass (FSG), or the like. There may also be a nitride-based layer formed of or comprising silicon nitride, silicon oxynitride (SiON), or the like. In accordance with some embodiments, the layers between the substrate 12 and the bond layer 14 may be formed using PECVD, CVD, LPCVD, ALD, or the like. There may also be alignment marks (not shown) formed between the bond layer 14 and the substrate 12. The alignment marks may be formed as metal plugs, which may be formed through damascene processes.

FIG. 1 further illustrates a first device wafer 30 attached to the carrier 10. In an embodiment, the first device wafer 30 may be an un-sawed wafer. In accordance with some embodiments, the first device wafer 30 includes a substrate 32, and integrated circuit devices (not separately illustrated) at a surface of the substrate 32. Examples of the integrated circuit devices may include Complementary Metal-Oxide Semiconductor (CMOS) transistors, resistors, capacitors, diodes, and/or the like.

In accordance with some embodiments, through-vias 36 are formed extending from a front side (illustrated as a bottom side) into the substrate 32. In accordance with other embodiments, no through-vias are formed at this stage, and the through-vias 36 are formed in subsequent processing. In some embodiments, the substrate 32 may be a semiconductor substrate such as a silicon substrate. In accordance with other embodiments, the substrate 32 may include other semiconductor materials such as silicon germanium, carbon-doped silicon, or the like. The substrate 32 may be a bulk substrate, or may have a layered structure, for example, including a silicon substrate and a silicon germanium layer over the silicon substrate. In an embodiment, the substrate 32 may be formed of a same material as the substrate 12 in the carrier 10, so that in the subsequent packaging process, the warpage due to the mismatch in Coefficients of Thermal Expansion (CTE) values between the carrier 10 and the first device wafer 30 is reduced.

In accordance with some embodiments, the first device wafer 30 includes device dies, which may include logic dies, memory dies, input-output dies, Integrated Passive Devices (IPDs), or the like, or combinations thereof. For example, the logic device dies in the first device wafer 30 may be Central Processing Unit (CPU) dies, Graphic Processing Unit (GPU) dies, mobile application dies, Micro Control Unit (MCU) dies, BaseBand (BB) dies, Application processor (AP) dies, or the like. The memory dies in the first device wafer 30 may include Static Random-Access Memory (SRAM) dies, Dynamic Random-Access Memory (DRAM) dies, or the like. The first device wafer 30 may be a simple device wafer including a semiconductor substrate extending continuously throughout the first device wafer 30, or may be a reconstructed wafer including device dies packaged therein, which device dies may be integrated as a system.

In accordance with some embodiments, a front-side interconnect structure 38 is formed on the front side of the substrate 32. The front-side interconnect structure 38 may comprise of a plurality of dielectric layers 40 and conductive features (not separately illustrated) within the plurality of dielectric layers 40. In an embodiment, the plurality of dielectric layers 40 may comprise such dielectric structures as an Inter-Layer Dielectric (ILD), Inter-Metal Dielectrics (IMDs), non-low-k passivation layers, polymer layers, and/or the like. One such dielectric layer may be a passivation layer (not separately illustrated) deposited or otherwise formed over a bottom surface (as illustrated in FIG. 1) of the substrate 32. In an embodiment, metal pads 44 (e.g., aluminum pads) may be embedded within the passivation layer, wherein a bottom surface of the metal pads 44 is planar with a bottom surface of the passivation layer. Other dielectric layers may be formed between the passivation layer and the substrate 32, for example, the ILD or IMDs, and may further comprise additional conductive features. Further, a dielectric bond layer (not separately illustrated) may be part of the plurality of dielectric layers 40 as an outer most dielectric layer. In an embodiment, the dielectric bond layer may act and be formed in a similar manner and from similar materials as the bond layer 14. The dielectric bond layer may be in physical contact sidewalls of the substrate 32 and be the outer most dielectric layer of the plurality of dielectric layers 40 to be utilized in subsequent bonding.

In an embodiment, the front-side interconnect structure 38 further includes the additional conductive features in the plurality of dielectric layers 40. The conductive features may include contact plugs, metal lines, and metal pads (e.g., the metal pads 44), metal vias (e.g., the through-vias 36), and/or the like. The contact plugs may be formed of tungsten, aluminum, copper, titanium, tantalum, titanium nitride, tantalum nitride, alloys therefore, and/or multi-layers thereof. Each of the metal lines and the metal vias may include a diffusion barrier layer and a copper-containing metallic material on the diffusion barrier layer. The diffusion barrier layer may include titanium, titanium nitride, tantalum, tantalum nitride, or the like.

In accordance with some embodiments, the metal pads 44 are formed in the plurality of dielectric layers 40. The metal pads 44 may be formed of or comprise aluminum, copper, nickel, titanium, palladium, or the like, or alloys thereof. In accordance with some embodiments, the metal pads 44 are in the passivation layer. In accordance with some embodiments, a polymer layer (which may be polyimide, polybenzoxazole (PBO), or the like) may be formed, with the metal pads 44 being in the polymer layer.

In an embodiment, the first device wafer 30 is bonded to the carrier 10 through wafer-on-wafer bonding. A surface dielectric layer in the plurality of dielectric layers 40 (e.g., the dielectric bond layer) is bonded to the bond layer 14 through fusion bonding. In an embodiment, the fusion bonding forms Si—O—Si bonds to join the surface dielectric layer (e.g., the dielectric bond layer) in the plurality of dielectric layers 40 to the bond layer 14.

Further illustrated in FIG. 1, an edge-sealing layer 48 is dispensed into the edge gap between the substrate 12 and the substrate 32, which may be over the dielectric layers 40. In accordance with some embodiments, the edge-sealing layer 48 is formed of or comprises a polymer, which may be polyimide, PBO, or the like. The edge-sealing layer 48 may be dispensed in a flowable form, and may then be cured and solidified. Furthermore, the edge-sealing layer 48 may be dispensed as a ring fully encircling the front-side interconnect structure 38.

Figure 2:
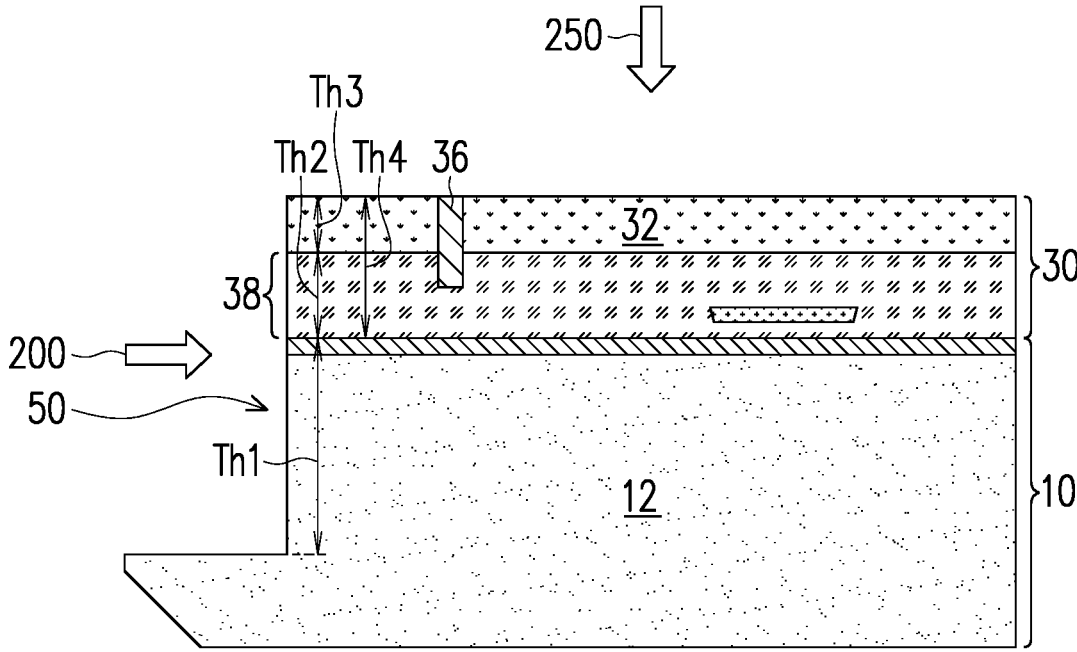

Referring to FIG. 2, a first wafer edge trimming process 200 is performed to form a recess 50, which forms a recess ring along the peripheral of the carrier 10 and the first device wafer 30. A backside planarization process 250 is then performed from a backside of the first device wafer 30, and the substrate 32 is thinned. The backside planarization process 250 may be performed through a Chemical Mechanical Polish (CMP) process, a mechanical polishing process, a grinding process or the like. In an embodiment, during the backside planarization process 250, the edge-sealing layer 48 (not illustrated in FIG. 2) has the function of preventing the first device wafer 30 from peeling off from the carrier 10. In an embodiment, the backside planarization process 250 may be performed until the through-vias 36 are exposed.

Further following the backside planarization process 250, in an embodiment, portions of the substrate 32 may be further removed to form recesses (not separately illustrated). The recesses may be formed so that the through-vias 36 protrude from the substrate 32. The recesses may subsequently be filled by an isolation layer (not separately illustrated). In accordance with some embodiments, the recesses are formed in the substrate 32 utilizing an etching process that selectively etches the substrate 32 without significantly etching the through-vias 36. In some embodiments an isolation material may be formed in the recesses forming the isolation layer. The isolation layer may be formed of a dielectric material. The dielectric material may be an oxide such as silicon oxide, phosphosilicate glass (PSG), borosilicate glass (BSG), boron-doped phosphosilicate glass (BPSG), a tetraethyl orthosilicate (TEOS) based oxide, or the like, which may be formed by a suitable deposition process such as CVD, ALD, or the like. Other suitable dielectric materials, such as a low temperature polyimide material, polybenzoxazole (PBO), an encapsulant, combinations thereof, or the like may also be utilized. The isolation layer may isolate the through-vias 36 and the substrate 32 of the first device wafer 30. Further, in an embodiment, another planarization process may be performed on the dielectric material of the isolation layer to remove excess material from the isolation layer until top surfaces of the through-vias 36 are adequately exposed through the isolation layer. In this embodiment, the planarization process may be any adequate planarization process such as a CMP process, a grinding process, the like, or a combination thereof.

In an embodiment, the first wafer edge trimming process 200 may result in the carrier 10 having a first thickness Th1 in the recess 50 with a portion of the substrate 12 remaining under the recess 50. The first thickness Th1 may be in a range of 5 µm to 350 µm. Additionally, the front-side interconnect structure 38 may be formed to have a second thickness Th2. The second thickness Th2 may be in a range of 0.1 µm to 30 µm. Following the backside planarization process 250 and any subsequent planarization processes the substrate 32 may be formed to a third thickness Th3. The third thickness Th3 may be in a range of 0.1 µm to 200 µm. In an embodiment, the resulting first device wafer 30 may have a fourth thickness Th4. The fourth thickness Th4 may be in a range of 0.2 µm to 230 µm.

Figure 3:
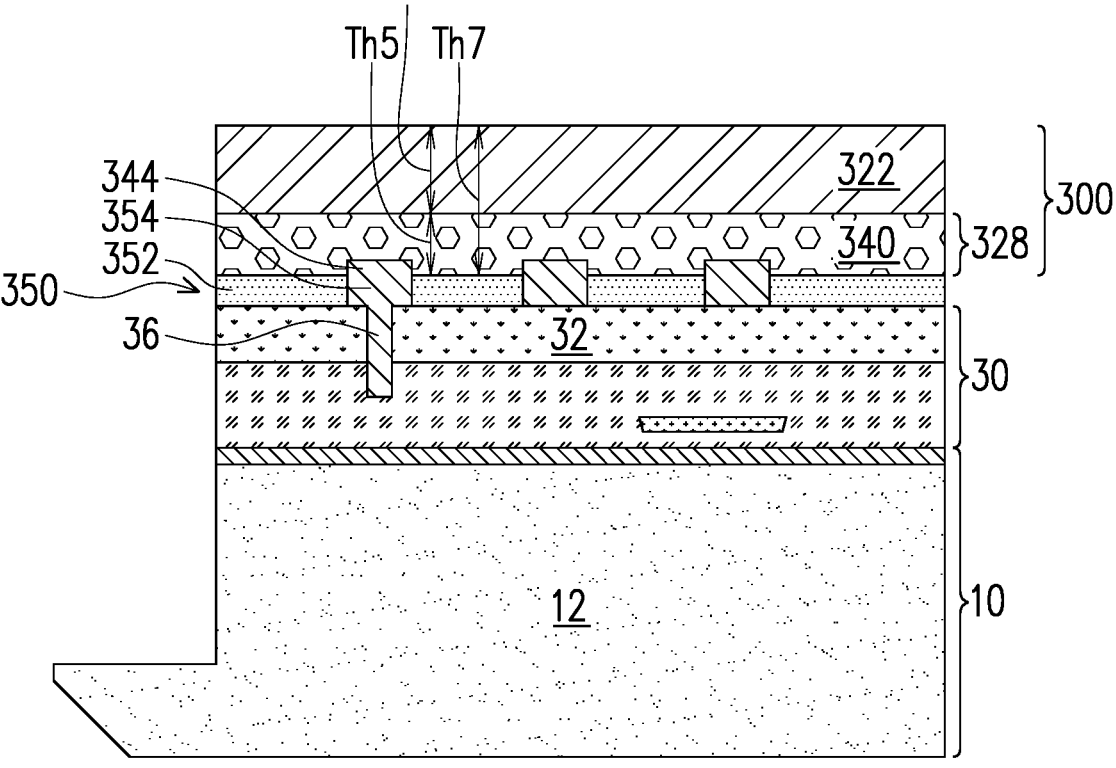

Referring to FIG. 3, a second device wafer 300 is attached to the first device wafer 30 utilizing a first bonding layer 350. In an embodiment, the first bonding layer 350 is formed over a backside surface of the first device wafer 30. In an embodiment, the first bonding layer 350 may comprise a dielectric layer 352 and first bond pads 354 within the dielectric layer 352. In some embodiments, the first bond pads 354 may comprise a conductive material such as copper, or the like. Some of the first bond pads 354 may be physically and electrically coupled to the through-vias 36. In an embodiment, the dielectric layer 352 may comprise a silicon-containing dielectric material such as silicon oxide, silicon nitride, silicon oxynitride, the like, or a combination thereof. In an embodiment, the dielectric layer 352 may be deposited using a suitable deposition process such as CVD, PVD, ALD, HDPCVD, the like, or a combination thereof. Optionally, a planarization step may then be performed to level a top surface of the first bonding layer 350 such that the first bonding layer 350 has a high degree of planarity. Other materials and formation methods are also possible.

In accordance with some embodiments, the first bond pads 354 may be formed over the isolation layer and the through-via 36 prior to the formation of the dielectric layer 352. As an example, to form the first bond pads 354, a seed layer (not separately illustrated) may be formed over the through-vias 36 and the substrate 32. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the first bond pads 354. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the first bond pads 354. Further, the dielectric layer 352 may be formed by spin coating, lamination, CVD, the like, or a combination thereof after the formation of the first bond pads 354, and then the dielectric layer 352 may be planarized to expose the first bond pads 354.

In accordance with another embodiment, the dielectric layer 352 is formed before the first bond pads 354. The dielectric layer 352 may be formed over the substrate 32 by spin coating, lamination, CVD, the like, or a combination thereof. The first bond pads 354 may then be formed in the dielectric layer 352 by forming recesses (not separately illustrated) in the dielectric layer 352, for example, through etching, milling, laser techniques, the like, or a combination thereof. A thin barrier layer (not separately illustrated) may be conformally deposited in the recesses, such as by CVD, ALD, PVD, thermal oxidation, a combination thereof, or the like. The barrier layer may be formed from an oxide, a nitride, a carbide, combinations thereof, or the like. A conductive material may be deposited over the barrier layer and in the recesses. The conductive material may be formed by an electro-chemical plating process, CVD, ALD, PVD, the like, or a combination thereof. Examples of the conductive materials include copper, tungsten, aluminum, silver, gold, a combination thereof, or the like. Excess conductive material and the barrier layer may then be removed from a surface of the dielectric layer 352, for example, by a planarization process, such as a CMP process. The remaining portions of the barrier layer and the conductive material in the recesses form the first bond pads 354.

FIG. 3 further illustrates the attachment of the second device wafer 300 to the first device wafer 30 utilizing the first bonding layer 350. In an embodiment, the second device wafer 300 may be an un-sawed wafer. In accordance with some embodiments, the second device wafer 300 includes a substrate 322, integrated circuit devices (not separately illustrated) at a surface of the substrate 322, and a front-side interconnect structure 328. In an embodiment, the integrated circuit devices may comprise Complementary Metal-Oxide Semiconductor (CMOS) transistors, resistors, capacitors, diodes, and/or the like. In an embodiment, the front-side interconnect structure 328 is formed on the front side of the substrate 322. The front-side interconnect structure 328 may include a plurality of dielectric layers 340 such as an Inter-Layer Dielectric (ILD), Inter-Metal Dielectrics (IMDs), non-low-k passivation layers, polymer layers, and/or the like. In accordance with some example embodiments, the ILD is formed of or comprises silicon oxide, PSG, BSG, BPSG, FSG, or the like. The IMD layers may be formed of low-k dielectric materials having dielectric constant values (k-values) lower than about 3.0. For example, the IMD layers may comprise a carbon-containing low-k dielectric material(s), Hydrogen SilsesQuioxane (HSQ), MethylSilsesQuioxane (MSQ), or the like.

In an embodiment, the front-side interconnect structure 328 further includes conductive features in the dielectric layers. The conductive features may include contact plugs, metal lines, and metal pads, metal vias, and/or the like, for example metal pads 344. The contact plugs may be formed of tungsten, aluminum, copper, titanium, tantalum, titanium nitride, tantalum nitride, alloys therefore, and/or multi-layers thereof. Each of the metal lines and the metal vias may include a diffusion barrier layer and a copper-containing metallic material on the diffusion barrier layer. The diffusion barrier layer may include titanium, titanium nitride, tantalum, tantalum nitride, or the like.

In accordance with some embodiments, the metal pads 344 are formed in the plurality of dielectric layers 340. The metal pads 344 may be formed of or comprise aluminum, copper, nickel, titanium, palladium, or the like, or alloys thereof. In accordance with some embodiments, metal pads 344 are in a passivation layer. In accordance with some embodiments, a polymer layer (which may be polyimide, polybenzoxazole (PBO), or the like) may be formed, with the metal pads 344 being in the polymer layer. In an embodiment, the metal pads 344 are formed and may be subsequently processed such that the metal pads 344 have an exposed surface at an exterior surface of the dielectric layers 340.

Further, the second device wafer 300 may be attached to the first device wafer 30 by bonding features of the front-side interconnect structure 328 to the first bonding layer 350. In some embodiments, bonding first device wafer 30 to the second device wafer 300 comprises a dielectric-to-dielectric and metal-to-metal bonding process performed between the first bonding layer 350 and features of the front-side interconnect structure 328 (e.g., the dielectric layers 340 and the metal pads 344). In some embodiments, the dielectric-to-dielectric bonding process forms a direct bond (e.g. a fusion bond such as an oxide-to-oxide bond) between the dielectric layer 352 and the dielectric layers 340. Further, the metal-to-metal bonding process may directly bond the first bond pads 354 of the first bonding layer 350 to the metal pads 344 of the front-side interconnect structure 328 through direct metal-to-metal bonding. Thus, electrical connection between the first device wafer 30 and the second device wafer 300 may be provided by the physical connection of the first bond pads 354 to the metal pads 344.

The dielectric-to-dielectric bonding process may start with applying a surface treatment to either or both of the dielectric layer 352 and the dielectric layers 340 facilitating a dielectric-to-dielectric bond between the dielectric layer 352 and the dielectric layers 340 (e.g. a such as an oxide-to-oxide bond). The surface treatment may include a plasma treatment. The plasma treatment may be performed in a vacuum environment. After the plasma treatment, the surface treatment may further include a cleaning process (e.g., a rinse with deionized water, or the like) that may be applied to either or both of the dielectric layer 352 and the dielectric layers 340.

The dielectric-to-dielectric and metal-to-metal bonding process may then proceed to aligning the first bond pads 354 to the metal pads 344. Next, the dielectric-to-dielectric and metal-to-metal bonding process includes a pre-bonding step, during which the second device wafer 300 is put in contact with the first bonding layer 350. The pre-bonding may be performed at room temperature (e.g., between about 21° C. and about 25° C.). The dielectric-to-dielectric and metal-to-metal bonding process continues with performing an anneal, for example, at a temperature between about 150° C. and about 400° C. for a duration between about 0.5 hours and about 3 hours, so that the first bond pads 354 (e.g., copper) and the metal pads 344 (e.g., copper) inter-diffuse to each other, and hence the direct metal-to-metal bonding is formed.

Following the bonding of the second device wafer 300 to the first device wafer 30, in some embodiments, a second wafer edge trimming process may be performed. The second wafer edge trimming process may trim edges of the second device wafer 300 as well as the first device wafer 30. In some embodiments, the second wafer edge trimming process results in the edges of the second device wafer 300 and the first device wafer 30 being planar.

In an embodiment, the front-side interconnect structure 38 of the second device wafer 300 is formed to a fifth thickness Th5. The fifth thickness may be in a range of 0.1 μm to 30 μm. Additionally the substrate 322 may have a sixth thickness Th6. The sixth thickness Th6 may be in a range of 0.1 μm to 775 μm. In this embodiment, the second device wafer 300 may have a seventh thickness Th7. The seventh thickness Th7 may be in a range of 0.2 μm to 805 μm.

Figure 13:
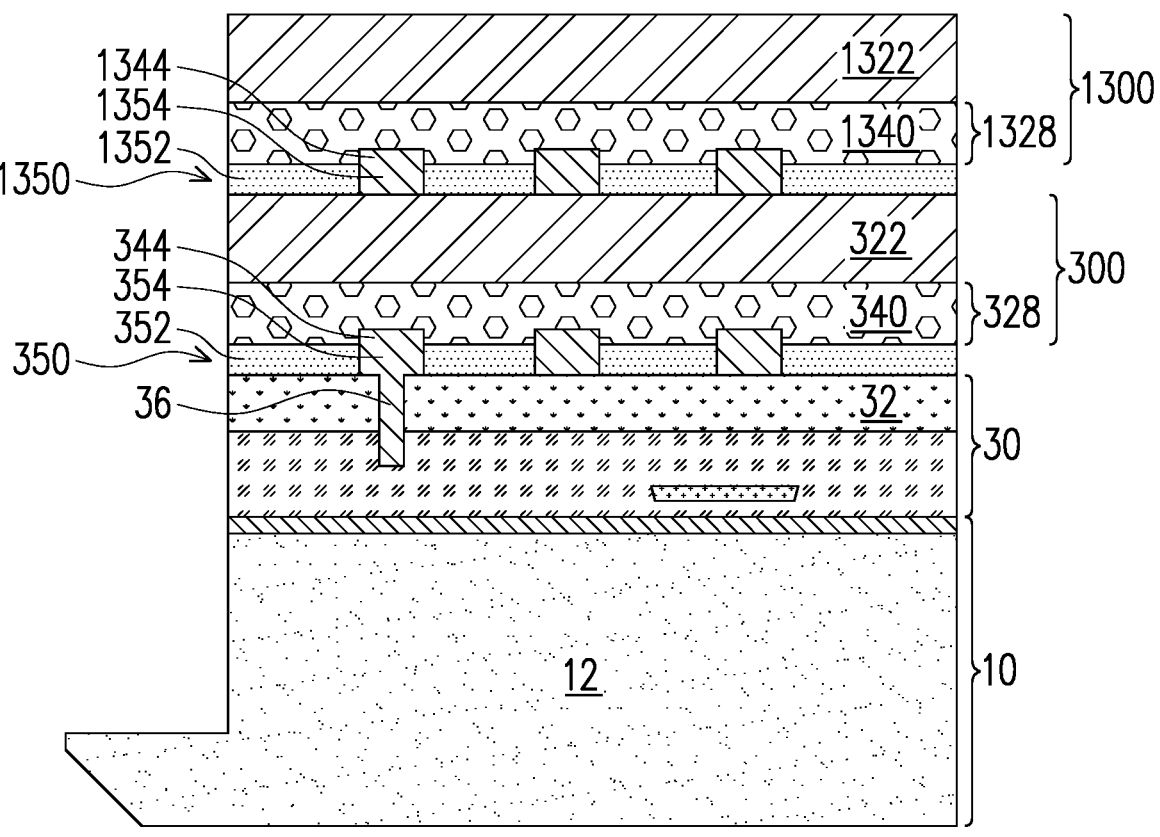
FIGS. 13-14 illustrate additional wafer devices bonded to the wafer on wafer structure to form a semiconductor package.
Figure 14:
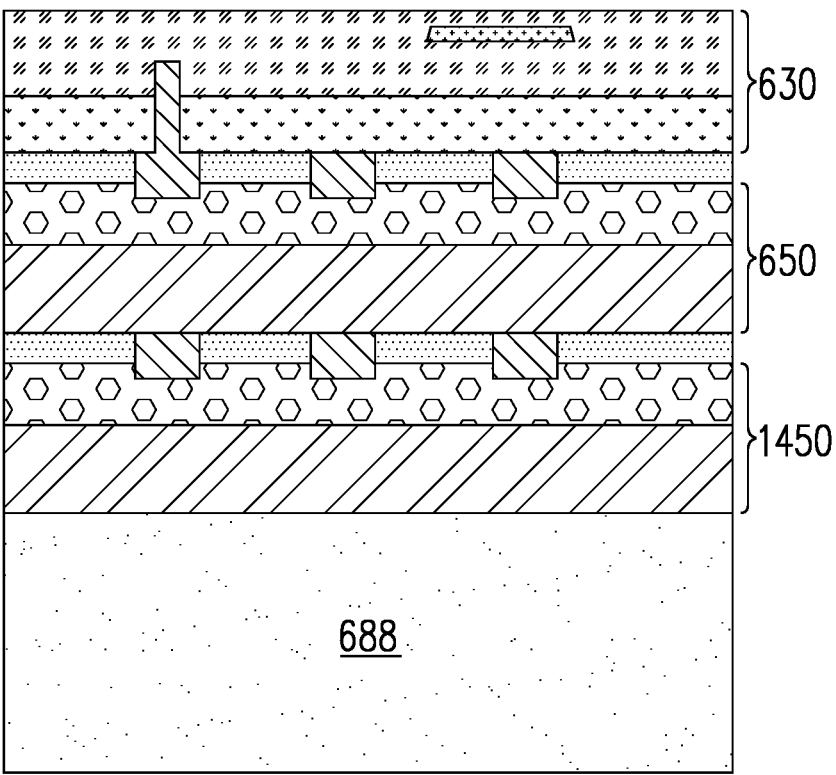

Further, it should be noted that the process for attaching the second device wafer 300 to the first device wafer 30 may be repeated to form a stack of any number of device wafers as desired (one such embodiment is illustrated in FIGS. 13 and 14). The device wafers may form electrical connections to each other through metallization lines and vias contained within the device wafers. Additionally, in an embodiment, each device wafer (e.g., the first device wafer 30, the second device wafer 300, etc.) have an area in a top down view that is equal or substantially equal to the area of the other device wafers.

Figure 4:
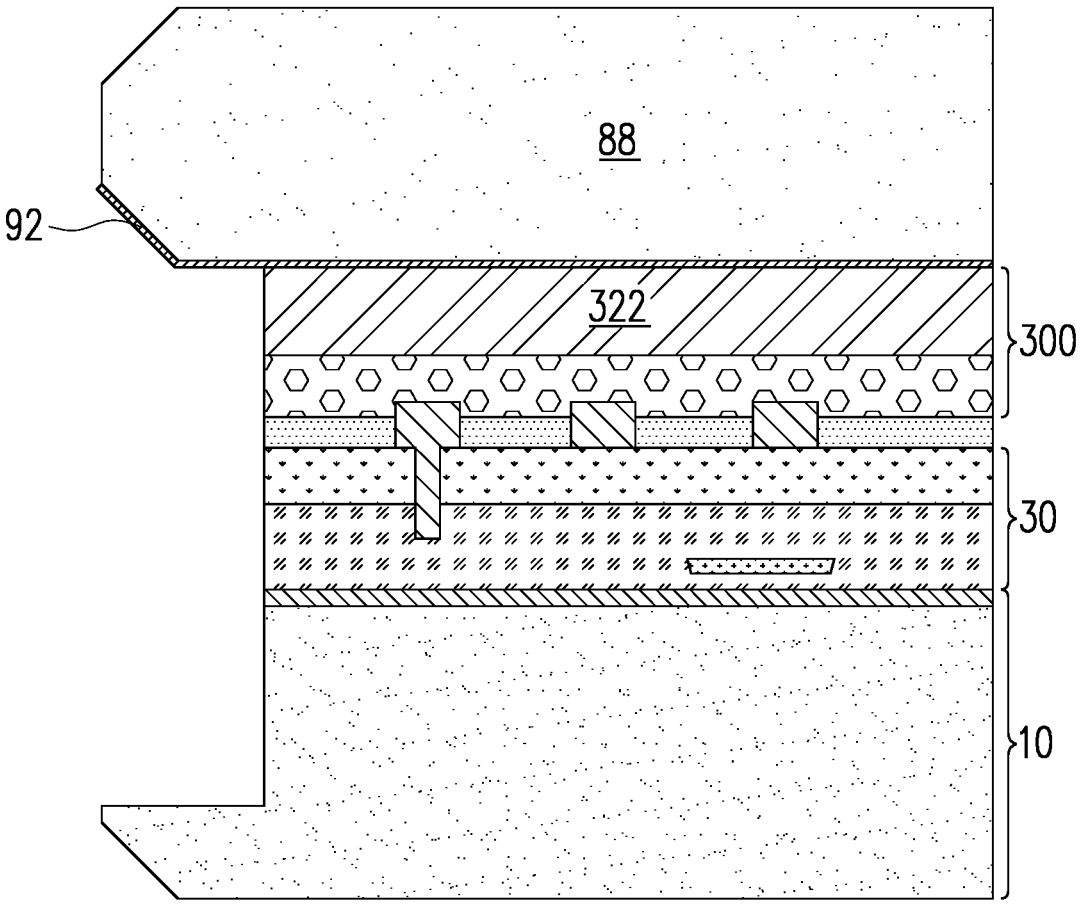

Referring to FIG. 4, a supporting substrate 88 is attached to the substrate 322 on a back side of the second device wafer 300 to in accordance with some embodiments. In some embodiments, the supporting substrate 88 is in wafer form, and hence is also referred to as a supporting wafer. The supporting substrate 88 may be bonded to substrate 322. In accordance with some embodiments, a bond layer 92 is pre-formed on the supporting substrate 88, for example, through a thermal oxidation process or a deposition process, and the structure including both of the bond layer 92 and the supporting substrate 88 are bonded to the substrate 322.

In an embodiment, the bond layer 92 may be a silicon-containing dielectric layer formed of or comprising $SiO_2$, SiN, SiC, SiON, or the like. The deposition process may include LPCVD, PECVD, PVD, ALD, PEALD, or the like. The supporting substrate 88 may be formed of a material that has a high thermal conductivity. In accordance with some embodiments, the supporting substrate 88 is a silicon substrate, while another type of substrate such as another semiconductor substrate, a dielectric substrate, a metallic substrate, or the like may be used. The entire supporting substrate 88 may be formed of a homogenous material. For example, the supporting substrate 88 may be free from active and passive devices, metal lines, dielectric layers, and the like therein. The bonding of bond layer 92 to the substrate 322 may include fusion bonding.

In accordance with some embodiments, after the bonding process, the supporting substrate 88 is thinned, for example, in a mechanical grinding process or a CMP process, so that the thickness of the supporting substrate 88 is reduced to a proper value. In an embodiment, thinning the supporting substrate 88 makes the supporting substrate 88 thick enough to support subsequent grinding, and is not too thick. In accordance with some embodiments, the supporting substrate 88 is not thinned.

Figure 5:
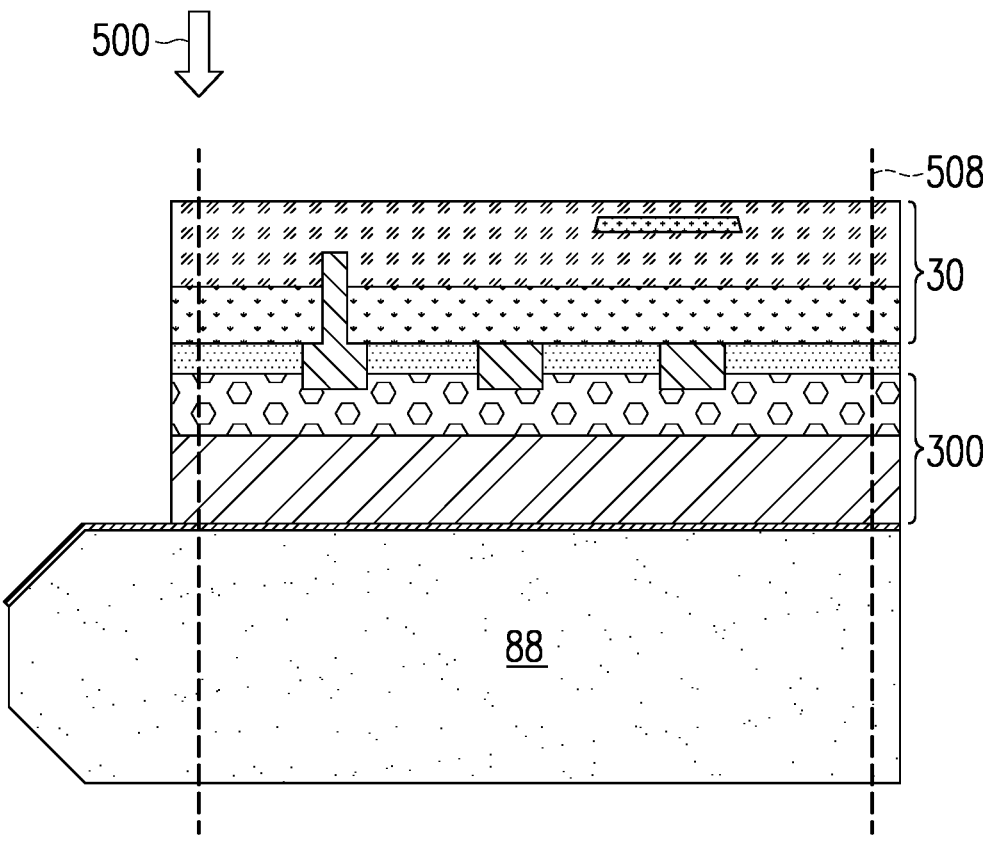

Referring to FIG. 5, following the bonding of the second device wafer 300 to the first device wafer 30, the resulting intermediate wafer on wafer structure illustrated in FIG. 4 is flipped upside as illustrated in FIG. 5. It should be noted that the wafer on wafer structure was formed free of any insulating or gap fill material. In an embodiment, the carrier 10 may be removed through a planarization process, such as a mechanical grinding process, a CMP process, the like, or a combination thereof. In an embodiment, a singulation process 500 may be performed along scribe lines 508. The singulation process 500 may be a sawing process, trimming process, or the like. However, any suitable singulation process may be performed resulting in the first semiconductor package 600 (not illustrated in FIG. 5, but illustrated in FIG. 6). Further, in an embodiment, the integrated circuit devices in the first device wafer 30 and the integrated circuit devices in the second device wafer 300 are aligned as to form functional circuits between the first device wafer 30 and the second device wafer 300 after the singulation process 500 in the resulting first semiconductor package 600.

Figure 6:
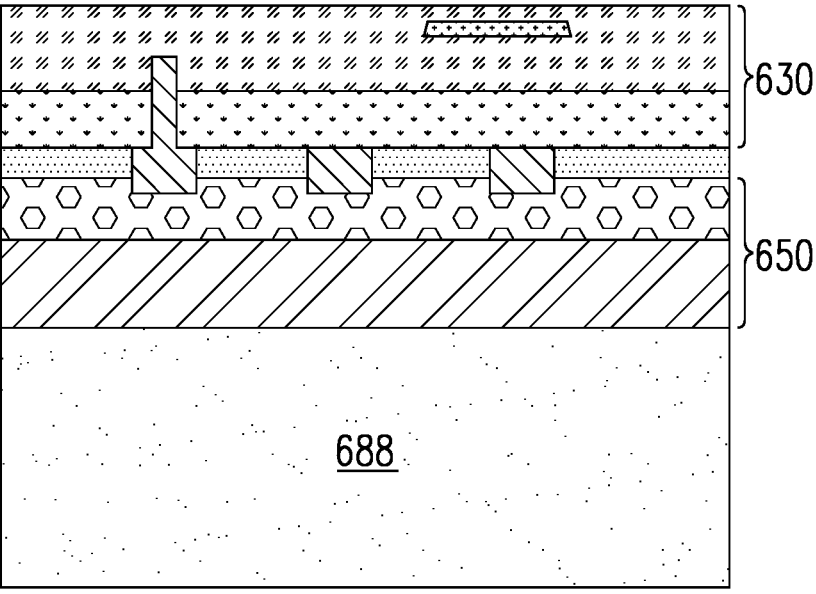

Referring to FIG. 6, the singulation process 500 forms the first semiconductor package 600. In an embodiment, the first semiconductor package comprises a carrier substrate 688, a first semiconductor device 630, and a second semiconductor device 650. In an embodiment, the carrier substrate 688 is formed from a portion of the supporting substrate 88 as a result of the singulation process 500. The first semiconductor device 630 may be formed from a portion of the first device wafer 30 as a result of the singulation process 500. The second semiconductor device 650 may be formed from a portion of the second device wafer 300 as a result of the singulation process 500. In an embodiment, sidewalls of the carrier substrate 688, sidewalls of the first semiconductor device 630, and sidewalls of the second semiconductor device 650 may be substantially planar (within process variations) with each other as a result of the singulation process 500.

Benefits of the embodiment discussed with respect to FIGS. 1-6 are achieved through the reduction of cost and cycle time. By directly bonding the first device wafer 30 to the second device wafer 300 (and potentially subsequent additional device wafers) a plurality of semiconductor packages may be formed from the WoWoW structure following the singulation process 500 without the need for individual die preparation and gapfill processing associated with bonding individual chips to form such 3DIC packages. The reduction of individual die preparation and gapfill processing reduces both cost savings and manufacturing cycle time.

FIGS. 7 through 12 illustrate another embodiment in which a second semiconductor package 1200 (illustrated in FIG. 12) is formed. In this embodiment, the second semiconductor package 1200 is formed through various processing steps of bonding one or more device wafers directly to a plurality of tier-1 semiconductor dies (tier-1 referring to the first structures bonded to a carrier wafer) utilizing support and carrier wafers during the processing steps. The bonding of one or more device wafers to the plurality of semiconductor dies utilizing the support and carrier wafers results in a chip-on-wafer-on-wafer (CoWoW) structure that may then be subsequently singulated into individual semiconductor packages (e.g., the second semiconductor package 1200).

Figure 7:
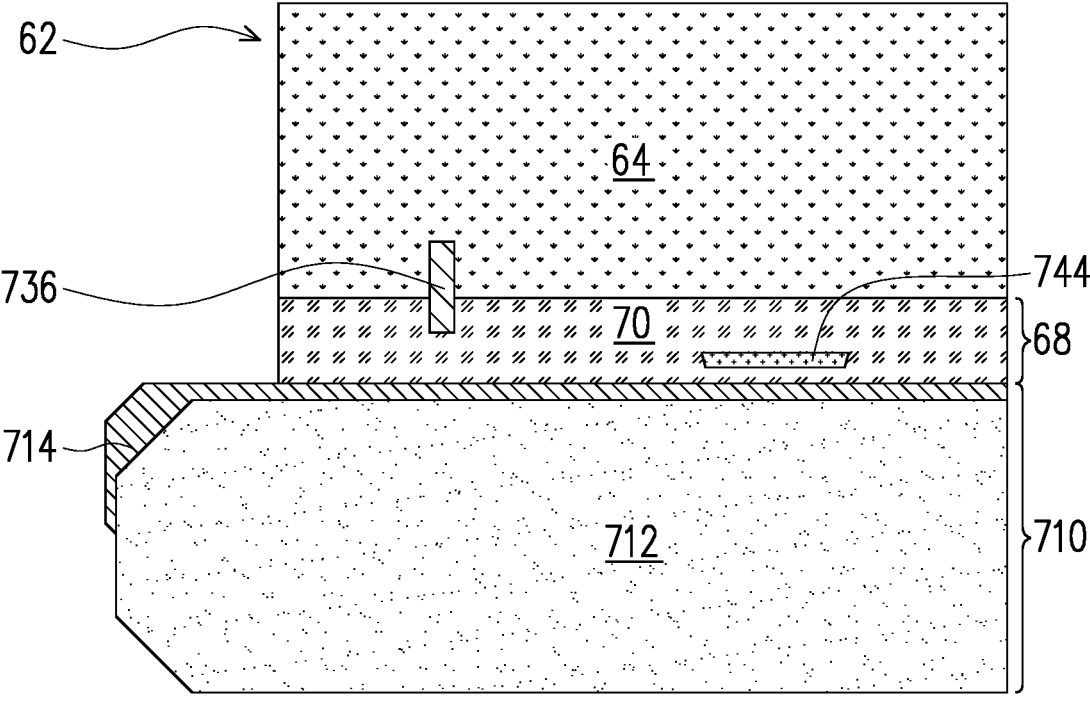
FIGS. 7-12 illustrate a chip on wafer bonding process and formation of a package in accordance with some embodiments.

Referring to FIG. 7, a plurality of device dies 62 are bonded to a wafer 710 in accordance with some embodiments. In an embodiment, the wafer 710 is a carrier that has no active devices (such as transistors) and passive devices therein, and hence may be referred to as carrier 710 hereinafter. The carrier 710 may have a round top view shape, with FIG. 7 illustrating an edge part of the wafer 710. In accordance with some embodiments, the carrier 710 includes a substrate 712. The substrate 712 may be a blank substrate. In an embodiment, the substrate 712 may be a semiconductor substrate such as a silicon substrate. In some embodiments, the substrate 712 may include other semiconductor materials such as silicon germanium, carbon-doped silicon, or the like. The substrate 712 may be a bulk substrate, or may have a layered structure, for example, including a silicon substrate and a silicon germanium layer over the silicon substrate. In some embodiments, the substrate 712 may be formed of other materials such as ceramic, glass, silicate glass, or the like may also be used. In accordance with some embodiments, the entire substrate 712 is formed of a homogeneous material, with no other material different from the homogeneous material therein. For example, the substrate 712 may be formed of silicon (doped or undoped), and there is no metal region, dielectric region, etc., therein.

In another embodiment, the wafer 710 is a device wafer including active devices (such as transistors) and/or passive devices (such as capacitors, resistors, inductors, and/or the like) therein. The wafer 710, when being the device wafer, may be an un-sawed wafer including a semiconductor substrate continuously extending into all device dies in the wafer, or may be a reconstructed wafer including discrete device dies that are packaged in an encapsulant (such as a molding compound or inorganic gap-filling regions).

In an embodiment, a bond layer 714 is deposited on the substrate 712. In accordance with some embodiments, the bond layer 714 is formed of or comprises a dielectric material, which may be a silicon-based dielectric material such as silicon oxide ($SiO_2$), SiN, SiON, SiOCN, SiC, SiCN, or the like, or combinations thereof. In accordance with some embodiments, the bond layer 714 is formed using High-Density Plasma Chemical Vapor Deposition (HDPCVD), Plasma Enhanced Chemical Vapor Deposition (PECVD), Chemical Vapor Deposition (CVD), Low-Pressure Chemical Vapor Deposition (LPCVD), Atomic Layer deposition (ALD), or the like.

In accordance with some embodiments, the bond layer 714 is in physical contact with the substrate 712. In accordance with some embodiments, the carrier 10 includes a plurality of layers (not shown) between the bond layer 714 and the substrate 712. For example, there may be an oxide-based layer formed of an oxide-based material (which may also be silicon oxide based) such as silicon oxide, phosphosilicate glass (PSG), borosilicate glass (BSG), boron-doped phospho silicate glass (BPSG), fluorine-doped silicate glass (FSG), or the like. There may also be a nitride-based layer formed of or comprising silicon nitride, silicon oxynitride (SiON), or the like. In accordance with some embodiments, the layers between the substrate 712 and the bond layer 714 may be formed using PECVD, CVD, LPCVD, ALD, or the like. There may also be alignment marks (not shown) formed between the bond layer 714 and the substrate 712. The alignment marks may be formed as metal plugs, which may be formed through damascene processes.

In an embodiment, the plurality of device dies 62 may each include a substrate 64, integrated circuits (not separately illustrated) at a surface of the substrate 64, an interconnect structure 68, which includes dielectric layers 70 and conductive features (not separately illustrated), and through-substrate vias (TSVs) 736. In an embodiment, the substrate 64 is formed in a similar manner and from similar materials as the substrate 32 as discussed above, and may further be formed to a same thickness as the thickness of the substrate 32. The plurality of device dies 62 may include logic dies, memory dies, input-output dies, or the like. For example, the logic device dies may be Central Processing Unit (CPU) dies, Graphic Processing Unit (GPU) dies, mobile application dies, Micro Control Unit (MCU) dies, BaseBand (BB) dies, Application processor (AP) dies, or the like. The memory dies may include Static Random-Access Memory (SRAM) dies, Dynamic Random-Access Memory (DRAM) dies, or the like.

The substrate 64 may be a silicon substrate. The dielectric layers 70 may include a passivation layer (not separately illustrated) over a surface of the substrate 64, a dielectric bonding layer (not separately illustrated) as an outer most dielectric layer of the dielectric layers 70 and additional dielectric layers (not separately illustrated) in between the passivation layer and the dielectric bonding layer. In an embodiment the dielectric layers 70 may be formed from similar materials and from similar processes to form similar structures as the plurality of dielectric layers 40 discussed above. However, any suitable materials and processes may be utilized to form the dielectric layers 70. The conductive features may include contact plugs, metal lines, and metal pads (e.g., metal pads 744), metal vias (e.g., the TSVs 736), and/or the like. The conductive features of the interconnect structure 68 may be formed in a similar manner and from similar processes as the conductive features of the front-side interconnect structure 38 discussed above, including to a same thickness as the front-side interconnect structure 38. However, any suitable materials and processes may be utilized to form the conductive features of the interconnect structure 68. For example, the contact plugs may be formed of tungsten, aluminum, copper, titanium, tantalum, titanium nitride, tantalum nitride, alloys therefore, and/or multi-layers thereof. Each of the metal lines and the metal vias may include a diffusion barrier layer and a copper-containing metallic material on the diffusion barrier layer. The diffusion barrier layer may include titanium, titanium nitride, tantalum, tantalum nitride, or the like.

In accordance with some embodiments, the metal pads 744 may be formed in the passivation layer of the dielectric layers 70 in a similar manner as discussed above with respect to the metal pads 44. The metal pads may be formed of or comprise aluminum, copper, nickel, titanium, palladium, or the like, or alloys thereof. In accordance with some embodiments, metal pads are in a passivation layer. In accordance with alternative embodiments, a polymer layer (which may be polyimide, polybenzoxazole (PBO), or the like) may be formed, with the metal pads being in the polymer layer.

In an embodiment, the plurality of device dies 62 may be bonded to the carrier 710 through dielectric-to-dielectric bonding. A surface dielectric layer (e.g., the dielectric bonding layer) in the dielectric layers 70 is bonded to the bond layer 714 through fusion bonding. In an embodiment, the fusion bonding forms Si—O—Si bonds to join the surface dielectric layer in the dielectric layers 70 to the bond layer 714.

Figure 8:
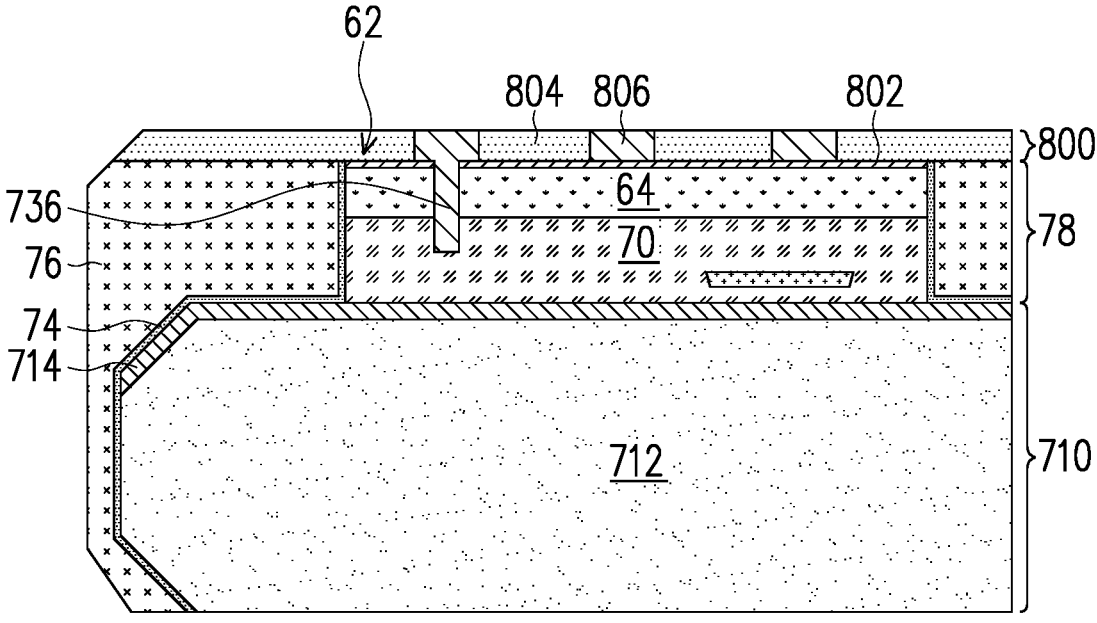

Referring to FIG. 8, a gap-filling process for forming gap-filling layers/regions 78 over the plurality of devices dies 62 (FIG. 7 illustrates a single device die 62 solely for clarity and one or more device dies 62 are fully intended to be included within the scope of this discussion) is illustrated. In an embodiment, the gap-filling layers 78 includes an adhesion layer 74, and a dielectric layer 76 over and contacting the adhesion layer 74. The adhesion layer 74 may be deposited using a conformal deposition process such as ALD, CVD, the like, or a combination thereof. Accordingly, the adhesion layer 74 may be a conformal layer, for example, with the thickness of the horizontal portions and the thickness of the vertical portions being substantially equal to each other (for example, with a variation of 20 percent or less). The adhesion layer 74 is formed of a dielectric material that has good adhesion to the sidewalls of the plurality of device dies 62 and the top surface of the bond layer 714. In accordance with some embodiments, the adhesion layer 74 is formed of or comprises a nitride-containing material such as silicon nitride.

In some embodiments, the dielectric layer 76 is formed of a material different from the material of the adhesion layer 74. In accordance with some embodiments, the dielectric layer 76 is formed of or comprises silicon oxide, while other dielectric materials such as silicon carbide, silicon oxynitride, silicon oxy-carbo-nitride, or the like may also be used. The dielectric layer 76 may be a non-conformal layer with the thicknesses of the horizontal portions and vertical portions being different from each other, or may be a conformal layer.

FIG. 8 additionally illustrates a formation of a second bonding layer 800 over the plurality of device dies 62 following a planarization process. In an embodiment, the planarization process may be performed to remove excess portions of the gap-filling layers 78 over the plurality of device dies 62, so that a top surface of the substrate 64 is exposed. The planarization process may further thin the substrate 64 to expose the TSVs 736 within the substrate 64. The planarization process may be a CMP process, a grinding process, a polishing process, the like, or a combination thereof.

Following the planarization process, in an embodiment, portions of the substrate 64 may be further removed to form recesses (not separately illustrated). The recesses may be formed so that the TSVs 736 protrude from the substrate 64. The recesses may subsequently be filled by an isolation layer

802. In accordance with some embodiments, the recesses are formed in the substrate 64 utilizing an etching process that selectively etches the substrate 64 without significantly etching the TSVs 736. In some embodiments, an isolation material may be formed in the recesses forming the isolation layer 802. The isolation layer 802 may be formed of a dielectric material. The dielectric material may be an oxide such as silicon oxide, phosphosilicate glass (PSG), borosilicate glass (BSG), boron-doped phosphosilicate glass (BPSG), a tetraethyl orthosilicate (TEOS) based oxide, or the like, which may be formed by a suitable deposition process such as CVD, ALD, or the like. Other suitable dielectric materials, such as a low temperature polyimide material, polybenzoxazole (PBO), an encapsulant, combinations thereof, or the like may also be utilized. The isolation layer 802 may isolate the TSVs 736 and the substrate 64 of the plurality of device dies 62.

Following the formation of the isolation layer 802, the second bonding layer 800 may be formed over a top surface of the gap-fill layers 78 and over the isolation layer 802. In an embodiment, the second bonding layer 800 may comprise a dielectric layer 804 and second bond pads 806 embedded within the dielectric layer 804. In some embodiments, the second bond pads 806 may comprise a conductive material such as copper, or the like. Some of the second bond pads 806 may be physically and electrically coupled to the TSVs 736. In an embodiment, the dielectric layer 804 may comprise a silicon-containing dielectric material such as silicon oxide, silicon nitride, silicon oxynitride, or the like, and the dielectric layer 804 may be deposited using a suitable deposition process such as CVD, PVD, ALD, HDPCVD, combinations of these, or the like. Optionally, a planarization step may then be performed to level a top surface of the second bonding layer 800 such that the second bonding layer 800 has a high degree of planarity. Other materials and formation methods are also possible. Further, the second bonding layer 800 may be formed in a similar manner as discussed above with respect to the first bonding layer 350.

Figure 9:
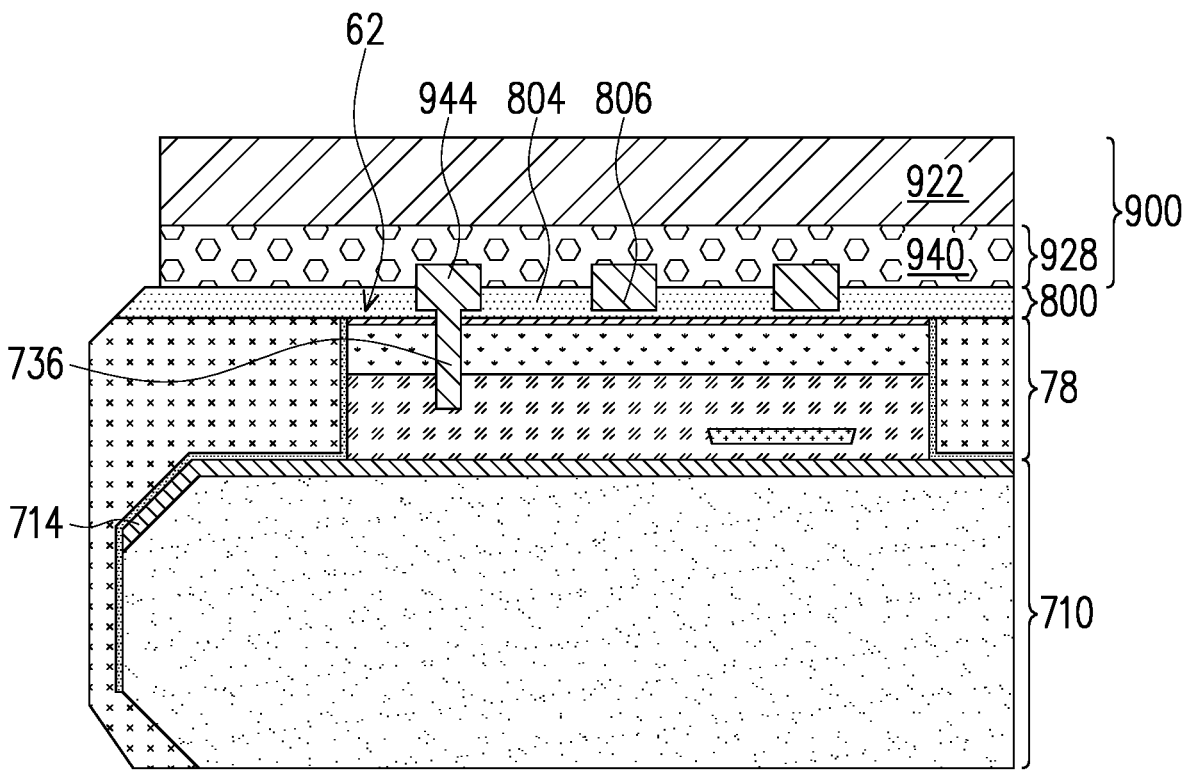

Referring to FIG. 9, a third device wafer 900 is attached to the plurality of device dies 62 over the gap-fill layers 78. In an embodiment, the third device wafer 900 may be an un-sawed wafer. In accordance with some embodiments, the third device wafer 900 includes a substrate 922, integrated circuit devices (not separately illustrated) at a surface of the substrate 922, and a front-side interconnect structure 928. In an embodiment, the integrated circuit devices may comprise Complementary Metal-Oxide Semiconductor (CMOS) transistors, resistors, capacitors, diodes, and/or the like. In an embodiment, the front-side interconnect structure 928 is formed on the front side of the substrate 922. The front-side interconnect structure 928 may include a plurality of dielectric layers 940 such as an Inter-Layer Dielectric (ILD), Inter-Metal Dielectrics (IMDs), non-low-k passivation layers, polymer layers, and/or the like. In accordance with some example embodiments, the ILD is formed of or comprises silicon oxide, PSG, BSG, BPSG, FSG, or the like. The IMD layers may be formed of low-k dielectric materials having dielectric constant values (k-values) lower than about 3.0. For example, the IMD layers may comprise a carbon-containing low-k dielectric material(s), Hydrogen Silses-Quioxane (HSQ), MethylSilsesQuioxane (MSQ), or the like.

In an embodiment, the front-side interconnect structure 928 further includes conductive features (not separately illustrated) in the plurality of dielectric layers 940. The conductive features may include contact plugs, metal lines, and metal pads, metal vias, and/or the like, for example metal pads 944. In an embodiment, the plurality of dielectric layers 940 and the conductive features within the plurality of dielectric layers 940 may be formed in a similar manner as the plurality of dielectric layers 340 and the conductive features contained within the plurality of dielectric layers 340 as discussed above. However, any suitable materials and processes may be utilized in forming the plurality of dielectric layers 940 and the conductive features therein.

In accordance with some embodiments, the metal pads 944 are formed in the dielectric layers 940. The metal pads 944 may be formed of or comprise aluminum, copper, nickel, titanium, palladium, or the like, or alloys thereof. In accordance with some embodiments, metal pads 944 are in a passivation layer. In accordance with some embodiments, a polymer layer (which may be polyimide, polybenzoxazole (PBO), or the like) may be formed, with the metal pads 944 being in the polymer layer. In an embodiment, the metal pads 944 are formed and may be subsequently processed such that the metal pads 944 have an exposed surface at an exterior surface of the dielectric layers 940.

Further, the third device wafer 900 may be attached to the plurality of device dies 62 by bonding features of the front-side interconnect structure 928 to the second bonding layer 800. In some embodiments, bonding the third device wafer 900 comprises a dielectric-to-dielectric and metal-to-metal bonding process performed between the second bonding layer 800 and features of the front-side interconnect structure 928 (e.g., the dielectric layers 940 and the metal pads 944). In some embodiments, the dielectric-to-dielectric bonding process forms a direct bond (e.g. a fusion bond such as an oxide-to-oxide bond) between the dielectric layer 804 and the dielectric layers 940. Further, the metal-to-metal bonding process may directly bond the second bond pads 806 of the second bonding layer 800 to the metal pads 944 of the front-side interconnect structure 928 through direct metal-to-metal bonding. Thus, electrical connection between the plurality of device dies 62 and the third device wafer 900 may be provided by the physical connection of the second bond pads 806 to the metal pads 944.

The dielectric-to-dielectric bonding process may start with applying a surface treatment to either or both of the dielectric layer 804 and the dielectric layers 940 facilitating a dielectric-to-dielectric bond between the dielectric layer 804 and the dielectric layers 940 (e.g. a such as an oxide-to-oxide bond). The surface treatment may include a plasma treatment. The plasma treatment may be performed in a vacuum environment. After the plasma treatment, the surface treatment may further include a cleaning process (e.g., a rinse with deionized water, or the like) that may be applied to either or both of the dielectric layer 804 and the dielectric layers 940.

The dielectric-to-dielectric and metal-to-metal bonding process may then proceed to aligning the second bond pads 806 to the metal pads 944. Next, the dielectric-to-dielectric and metal-to-metal bonding process includes a pre-bonding step, during which the third device wafer 900 is put in contact with the second bonding layer 800. The pre-bonding may be performed at room temperature (e.g., between about 21° C. and about 25° C.). The dielectric-to-dielectric and metal-to-metal bonding process continues with performing an anneal, for example, at a temperature between about 150° C. and about 400° C. for a duration between about 0.5 hours and about 3 hours, so that the second bond pads 806 (e.g., copper) and the metal pads 944 (e.g., copper) inter-diffuses to each other, and hence the direct metal-to-metal bonding is formed.

Figure 10:
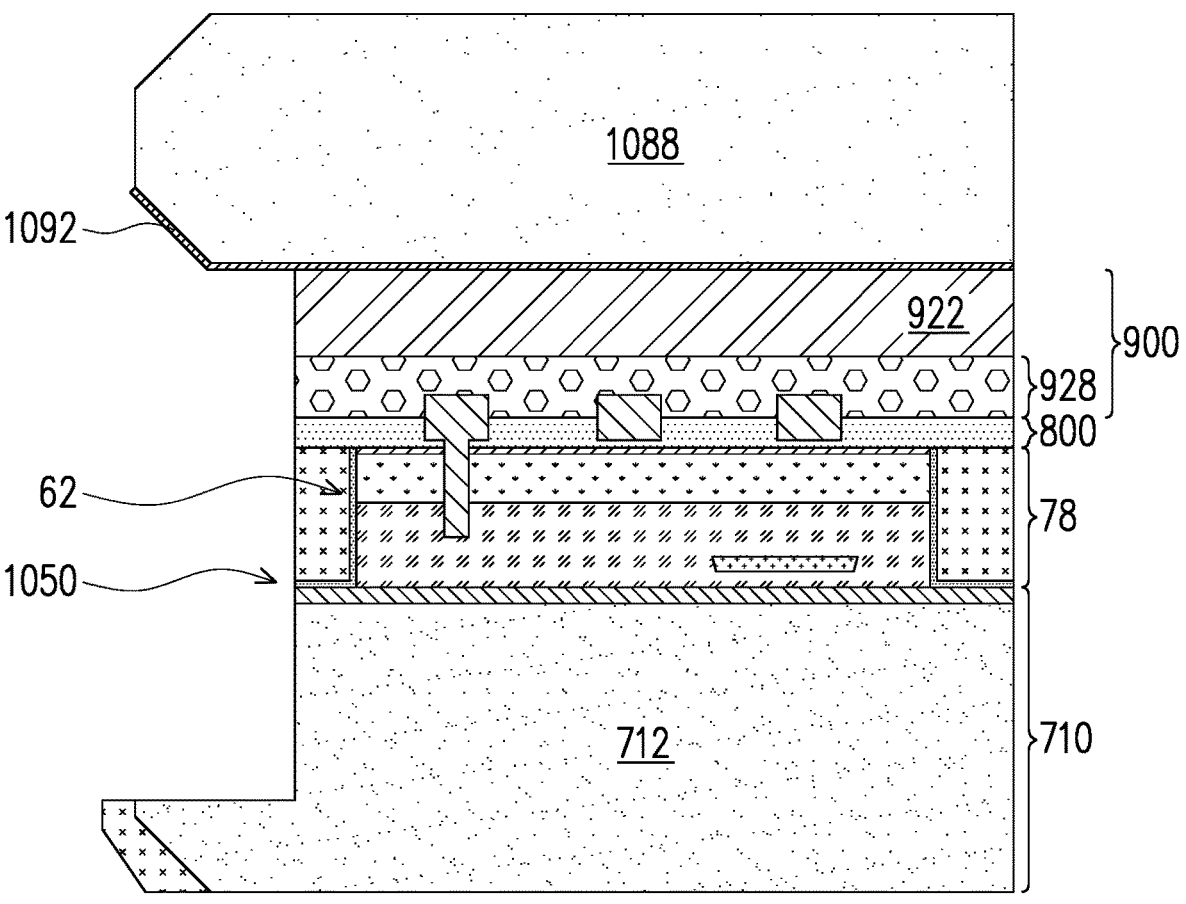

Referring to FIG. 10, a wafer edge trimming process is performed to form a recess 1050, which forms a recess ring along the peripheral of the carrier 710, the plurality of device dies 62 surrounded by the gap-fill layers 78, and the third device wafer 900. A backside planarization process may then be performed from a backside of the third device wafer 900, and the substrate 922 may be thinned. The backside planarization process may be performed through a CMP process, a mechanical polishing process, a grinding process or the like.

Further, following the wafer edge trimming process, a supporting substrate 1088 is attached to the substrate 922 on a back side of the third device wafer 900 in accordance with some embodiments. In some embodiments, the supporting substrate 1088 is in wafer form, and hence is also referred to as a supporting wafer. The supporting substrate 1088 may be bonded to substrate 922. In accordance with some embodiments, a bond layer 1092 is pre-formed on the supporting substrate 1088, for example, through a thermal oxidation process or a deposition process, and the structure including both of the bond layer 1092 and the supporting substrate 1088 are bonded to the substrate 922.

In an embodiment, the bond layer 92 may be a silicon-containing dielectric layer formed of or comprising $SiO_2$, SiN, SiC, SiON, or the like. The deposition process may include LPCVD, PECVD, PVD, ALD, PEALD, or the like. The supporting substrate 1088 may be formed of a material that has a high thermal conductivity. In accordance with some embodiments, the supporting substrate 1088 is a silicon substrate, while another type of substrate such as another semiconductor substrate, a dielectric substrate, a metallic substrate, or the like may be used. The entire supporting substrate 1088 may be formed of a homogenous material. For example, the supporting substrate 1088 may be free from active and passive devices, metal lines, dielectric layers, and the like therein. The bonding of bond layer 1092 to the substrate 922 may include fusion bonding.

In accordance with some embodiments, after the bonding process, the supporting substrate 1088 is thinned, for example, in a mechanical grinding process or a CMP process, so that the thickness of the supporting substrate 1088 is reduced to a proper value. In an embodiment, thinning the supporting substrate 1088 makes the supporting substrate 1088 thick enough to support subsequent grinding, and is not too thick. In accordance with some embodiments, the supporting substrate 1088 is not thinned.

Figure 11:
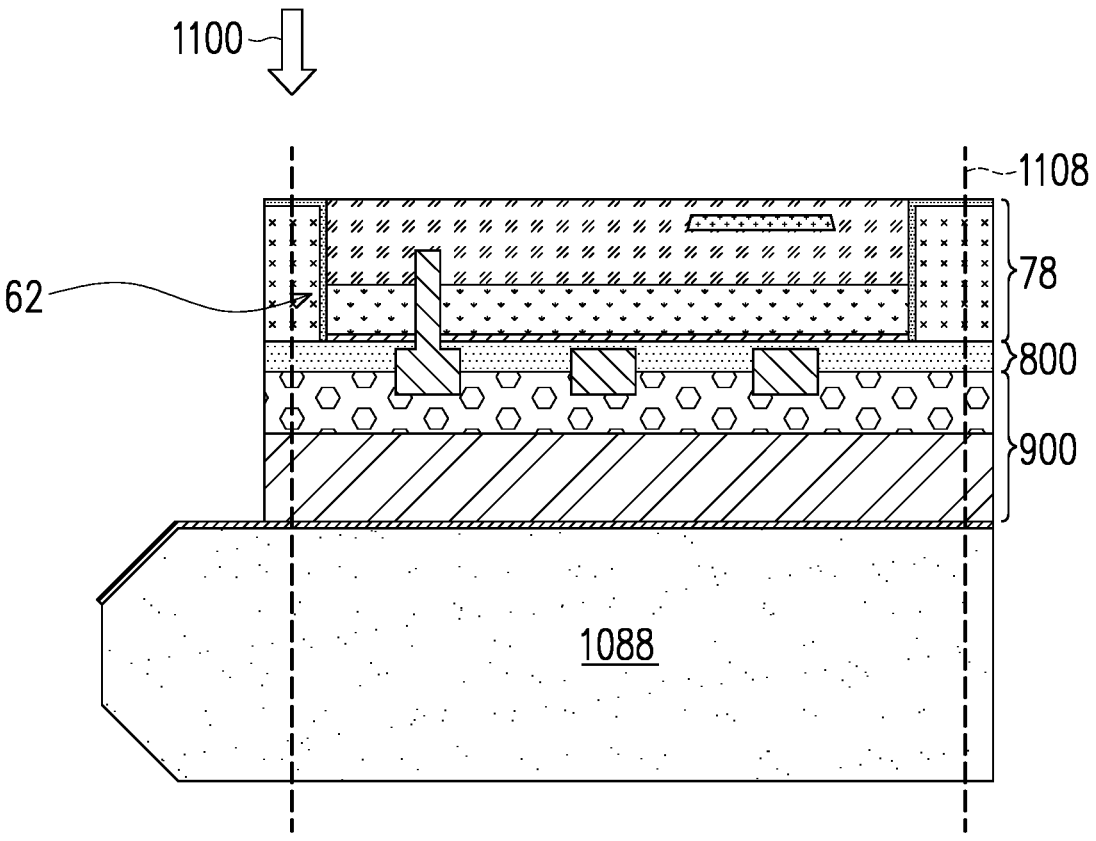

Referring to FIG. 11, following the bonding of the third device wafer 900 to the plurality of device dies 62, a resulting intermediate chip on wafer structure illustrated in FIG. 10 is flipped upside as illustrated in FIG. 11. In an embodiment, the carrier 710 may be removed through a planarization process, such as a mechanical grinding process, a CMP process, the like, or a combination thereof. In an embodiment, a singulation process 1100 may be performed along scribe lines 1108. The singulation process 1100 may be a sawing process, trimming process, or the like. However, any suitable singulation process may be performed resulting in the second semiconductor package 1200 (not illustrated in FIG. 11, but illustrated in FIG. 12).

Figure 12:
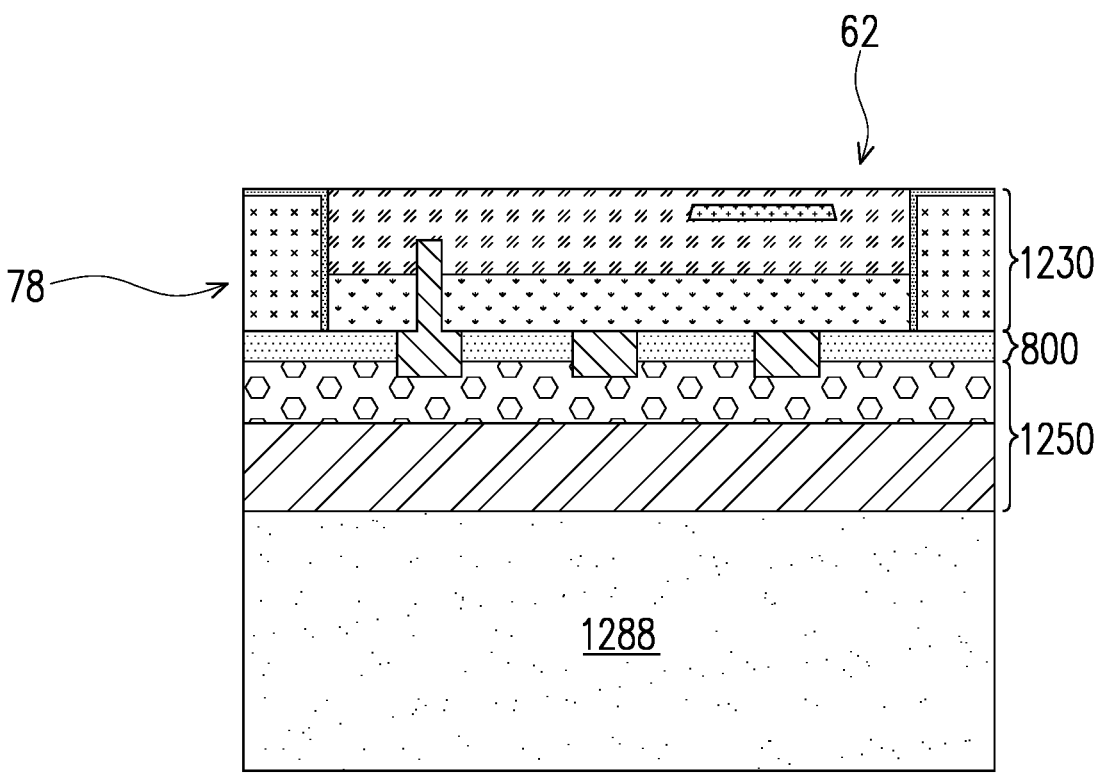

Referring to FIG. 12, the singulation process 1100 forms the second semiconductor package 1200. In an embodiment, the second semiconductor package comprises a carrier substrate 1288, a third semiconductor device 1230, and a fourth semiconductor device 1250. In an embodiment, the carrier substrate 1288 is formed from a portion of the supporting substrate 1088 as a result of the singulation process 1100. The third semiconductor device 1230 may be formed from individual device dies 62 surrounded by singulated portions of the gap-fill layers 78 as a result of the singulation process 1100. The fourth semiconductor device 1250 may be formed from a portion of the third device wafer 900 as a result of the singulation process 1100.

Referring to FIG. 13, an embodiment is illustrated in which additional device wafers (e.g., a fourth device wafer 1300) are bonded to the second device wafer 300 as depicted in FIG. 3. In this embodiment the fourth device wafer 1300 is bonded to the second device wafer 300 in a similar manner as the second device wafer 300 is bonded to the first device wafer 30. The additional device wafers (e.g., the fourth device wafer 1300) may be bonded to the structure illustrated in FIG. 3 prior to the processing steps performed in FIGS. 4-6. In an embodiment, the third bonding layer 1350 may be formed in a similar manner and from similar materials as the first bonding layer 350, with the inclusion of the dielectric layer 1352 and the third bond pads 1354 being formed in a similar manner and from similar materials as discussed above with respect to the dielectric layer 352 and the first bond pads 354. The conductive features of the interconnect structure 1328 of the fourth device wafer 1300 may be formed in a similar manner and from similar processes as the conductive features of the front-side interconnect structure 38 discussed above, including to a same thickness as the front-side interconnect structure 38. However, any suitable materials and processes may be utilized to form the conductive features of the interconnect structure 68. The conductive features, such as, may be formed in the dielectric layers 1340 in a similar manner as the dielectric layers 340 and the dielectric layers 1340 may be similar structures as the dielectric layers 340. Similarly, the metal pads 1344 may be formed in the dielectric layers 1340 in a similar manner as the metal pads 344 in the dielectric layers 340. Additionally, the substrate 1322 may be formed in a similar manner and from similar materials as the substrate 322, with the inclusion of similar structures contained within the substrate 1322. The intermediate structure illustrated in FIG. 13 may then proceed to follow similar process steps as described in FIGS. 4-5 resulting in a third semiconductor package 1400 as illustrated in FIG. 14.

Referring to FIG. 14, the third semiconductor package 1400 is illustrated following a singulation process similar to that as described above with respect to FIG. 5. In an embodiment, following the singulation process the first semiconductor device 630, the second semiconductor device 650, a fifth semiconductor device 1450, and the carrier substrate 688 are formed respectively from the first device wafer 30, the second device wafer 300, the fourth device wafer 1300, and the supporting substrate 88. In an embodiment, the third semiconductor package 1400 comprises the first semiconductor device 630, the second semiconductor device 650, the fifth semiconductor device 1450, and the supporting substrate 688.

The embodiments of the present disclosure achieve benefits. By bonding device wafers directly to device wafers (e.g., the first device wafer 30 to the second device wafer 300), the manufacturing cost and cycle time is reduced by eliminating the need to use a gap-filling process when forming the semiconductor packages. Combining the wafer-on-wafer process with chip-on-wafer bonding allows for more reliability in the manufacturing process of the integrated circuits.

In accordance with an embodiment, a method includes bonding a first device wafer to a first support wafer, bonding a second device wafer to the first device wafer, after the bonding the second device wafer to the first device wafer bonding a second support wafer to the second device wafer, wherein the second support wafer has a larger area in a top down view than both the first device wafer and the second device wafer, and performing a singulation process on the first device wafer, the second device wafer, and the second support wafer forming a singulated semiconductor package. In an embodiment, the forming the singulated semiconductor package is free from utilizing a gap-fill process. In an embodiment, the bonding the first device wafer to the first support wafer includes forming a fusion bond. In an embodiment, further including removing the first support wafer before the performing the singulation process. In an embodiment, the removing the first support wafer comprises performing a chemical mechanical polish. In an embodiment, further including performing a thinning process on the second support wafer prior to the performing the singulation process. In an embodiment, further including a first edge trimming process performed on the first support wafer and the first device wafer prior to the bonding the second device wafer to the first device wafer. In an embodiment, further including a second edge trimming process performed on the second device wafer after the bonding the second device wafer to the first device wafer. In an embodiment, the singulation process is a sawing process.

In accordance with an embodiment, a method includes utilizing a first bond layer of a first wafer to bond a plurality of device dies to the first wafer, depositing an insulating material over the first wafer, wherein the insulating material surrounds each of the plurality of device dies and encapsulates the first wafer, forming a second bond layer over exposed surfaces of the plurality of device dies and over the insulating material, bonding a first device wafer to the second bond layer opposite the plurality of device dies, after the bonding the first device wafer to the second bond layer, performing a first edge trimming process on the first device wafer, the insulating material, and the first wafer, and performing a singulation process through the first device wafer and through the insulating material between each of the plurality of device dies. In an embodiment, further including bonding a second device wafer to the first device wafer opposite the plurality of device dies. In an embodiment, further including performing a second edge trimming process on the second device wafer. In an embodiment, further including bonding a second wafer to the first device wafer opposite the plurality of device dies, and removing the first wafer prior to the performing the singulation process. In an embodiment, the insulating material comprises an adhesion layer formed from a first dielectric material and a dielectric layer formed over the adhesion layer from a second dielectric material, the second dielectric material different from the first dielectric material. In an embodiment, the performing the singulation process is performed along scribe lines, the scribe lines running through the insulating material between the plurality of device dies. In an embodiment, the plurality of device dies comprises logic dies.

In accordance with an embodiment, a method of manufacturing a semiconductor device includes bonding a first device wafer to a first carrier wafer, the first device wafer having a first area in a top down view, bonding a second device wafer to the first device wafer opposite the first carrier wafer, the second device wafer having the first area in the top down view, bonding a third device wafer to the second device wafer opposite the first device wafer, the third device wafer having the first area in the top down view, performing an edge trimming process, wherein after the edge trimming process a recess of the first carrier has sidewalls that are coplanar with sidewalls of the first device wafer, the second device wafer, and the third device wafer, after performing the edge trimming process, bonding a second carrier wafer to the third device wafer opposite the second device wafer, and after the bonding the second carrier wafer, removing the first carrier wafer. In an embodiment, further including performing a singulation process on the first device wafer, the second device wafer, the third device wafer, and the second carrier wafer. In an embodiment, the second carrier wafer comprises a homogenous substrate with an outer surface covered by a dielectric bond layer. In an embodiment, the bonding the second carrier wafer comprises forming a fusion bond between the dielectric bond layer and a dielectric layer of the third device wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   bonding a first device wafer to a first support wafer;
   bonding a second device wafer to the first device wafer;
   after the bonding the second device wafer to the first device wafer bonding a second support wafer to the second device wafer, wherein the second support wafer has a larger area in a top down view than both the first device wafer and the second device wafer; and
   performing a singulation process on the first device wafer, the second device wafer, and the second support wafer forming a singulated semiconductor package.

2. The method of claim 1, wherein the forming the singulated semiconductor package is free from utilizing a gap-fill process.

3. The method of claim 2, wherein the bonding the first device wafer to the first support wafer comprises forming a fusion bond.

4. The method of claim 3, further comprising removing the first support wafer before the performing the singulation process.

5. The method of claim 4, wherein the removing the first support wafer comprises performing a chemical mechanical polish.

6. The method of claim 1, further comprising performing a thinning process on the second support wafer prior to the performing the singulation process.

7. The method of claim 1, further comprising a first edge trimming process performed on the first support wafer and the first device wafer prior to the bonding the second device wafer to the first device wafer.

8. The method of claim 7, further comprising a second edge trimming process performed on the second device wafer after the bonding the second device wafer to the first device wafer.

9. The method of claim 1, wherein the singulation process is a sawing process.

10. A method comprising:
    utilizing a first bond layer of a first wafer to bond a plurality of device dies to the first wafer;

depositing an insulating material over the first wafer, wherein the insulating material surrounds each of the plurality of device dies and encapsulates the first wafer;

forming a second bond layer over exposed surfaces of the plurality of device dies and over the insulating material;

bonding a first device wafer to the second bond layer opposite the plurality of device dies;

after the bonding the first device wafer to the second bond layer, performing a first edge trimming process on the first device wafer, the insulating material, and the first wafer; and performing a singulation process through the first device wafer and through the insulating material between each of the plurality of device dies.

11. The method of claim 10, further comprising bonding a second device wafer to the first device wafer opposite the plurality of device dies.

12. The method of claim 11, further comprising performing a second edge trimming process on the second device wafer.

13. The method of claim 10, further comprising:

bonding a second wafer to the first device wafer opposite the plurality of device dies; and removing the first wafer prior to the performing the singulation process.

14. The method of claim 10, wherein the insulating material comprises an adhesion layer formed from a first dielectric material and a dielectric layer formed over the adhesion layer from a second dielectric material, the second dielectric material different from the first dielectric material.

15. The method of claim 10, wherein the performing the singulation process is performed along scribe lines, the scribe lines running through the insulating material between the plurality of device dies.

16. The method of claim 10, wherein the plurality of device dies comprises logic dies.

17. A method of manufacturing a semiconductor device comprising:

bonding a first device wafer to a first carrier wafer, the first device wafer having a first area in a top down view;

bonding a second device wafer to the first device wafer opposite the first carrier wafer, the second device wafer having the first area in the top down view;

bonding a third device wafer to the second device wafer opposite the first device wafer, the third device wafer having the first area in the top down view;

performing an edge trimming process, wherein after the edge trimming process a recess of the first carrier wafer has sidewalls that are coplanar with sidewalls of the first device wafer, the second device wafer, and the third device wafer;

after performing the edge trimming process, bonding a second carrier wafer to the third device wafer opposite the second device wafer; and after the bonding the second carrier wafer, removing the first carrier wafer.

18. The method of claim 17, further comprising performing a singulation process on the first device wafer, the second device wafer, the third device wafer, and the second carrier wafer.

19. The method of claim 17, wherein the second carrier wafer comprises a homogenous substrate with an outer surface covered by a dielectric bond layer.

20. The method of claim 19, wherein the bonding the second carrier wafer comprises forming a fusion bond between the dielectric bond layer and a dielectric layer of the third device wafer.

* * * * *